US008536466B2

(12) United States Patent
Shimizu (10) Patent No.: US 8,536,466 B2
(45) Date of Patent: Sep. 17, 2013

(54) TERMINAL BOX AND SOLAR CELL MODULE

(75) Inventor: Akira Shimizu, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 305 days.

(21) Appl. No.: 12/996,432

(22) PCT Filed: Jun. 3, 2009

(86) PCT No.: PCT/JP2009/060147
§ 371 (c)(1),
(2), (4) Date: Dec. 6, 2010

(87) PCT Pub. No.: WO2009/148078
PCT Pub. Date: Dec. 10, 2009

(65) Prior Publication Data
US 2011/0073362 A1 Mar. 31, 2011

(30) Foreign Application Priority Data
Jun. 4, 2008 (JP) .................................. 2008-147024

(51) Int. Cl.
*H01R 13/46* (2006.01)
(52) U.S. Cl.
USPC .......................................................... 174/520
(58) Field of Classification Search
USPC ................ 174/520, 549, 650, 659; 439/76.1, 439/76.2, 536
See application file for complete search history.

(56) References Cited

U.S. PATENT DOCUMENTS 6,166,321 A 12/2000 Sasaoka et al.
7,737,355 B2 * 6/2010 Nieleck et al. ................ 136/243

FOREIGN PATENT DOCUMENTS

| JP | 2-12878 | 1/1990 |
| JP | 11-17204 | 1/1999 |
| JP | 2001-250974 | 9/2001 |
| JP | 2005-353734 | 12/2005 |
| JP | 2006-41262 | 2/2006 |
| JP | 2006-269803 | 10/2006 |
| JP | 2006-310439 | 11/2006 |

OTHER PUBLICATIONS

International Search Report for PCT Application PCT/JP2009/060147, mailed Aug. 25, 2009.

* cited by examiner

*Primary Examiner* — Jeremy Norris
*Assistant Examiner* — Tremesha S Willis
(74) *Attorney, Agent, or Firm* — Nixon & Vanderhye P.C.

(57) ABSTRACT

According to one embodiment, a terminal box includes a box case placed on and fixed to a back film of a solar cell string and a terminal panel formed on the box case. The box case includes a case main body placed on and fixed to the back film of the solar cell string and a terminal panel fixing portion for placing and fixing the terminal panel above the case main body. An opening for passing an output lead wire through the terminal panel is formed continuously from the bottom face of the case main body to the top face of the terminal panel. One edge of the terminal panel is provided so as to protrude from the terminal panel fixing portion such that the tip of the output lead wire can be bent and latched on.

8 Claims, 7 Drawing Sheets

TERMINAL BOX AND SOLAR CELL MODULE

This application is the U.S. national phase of International Application No. PCT/JP2009/060147 filed 3 Jun. 2009, which designated the U.S. and claims priority to JP Application No. 2008-147024 filed 4 Jun. 2008, the entire contents of each of which are hereby incorporated by reference.

TECHNICAL FIELD

The present invention relates to a terminal box that electrically connects output lead wires that are connected to electrodes of solar cells and that are drawn through a back film of the solar cells, and more specifically, to a terminal box characterized by output lead wires connecting structure, and solar cells module including such a terminal box.

BACKGROUND ART

Solar power generation systems for generating solar power in which a plurality of solar cell strings are placed in a matrix on the roof of buildings or the like are beginning to come into wide use. In such solar cells power generation system, each, solar cell module is provided with a terminal box that can make an electrical connection with another solar cell module placed adjacent to the solar cell module.

Figure 5:
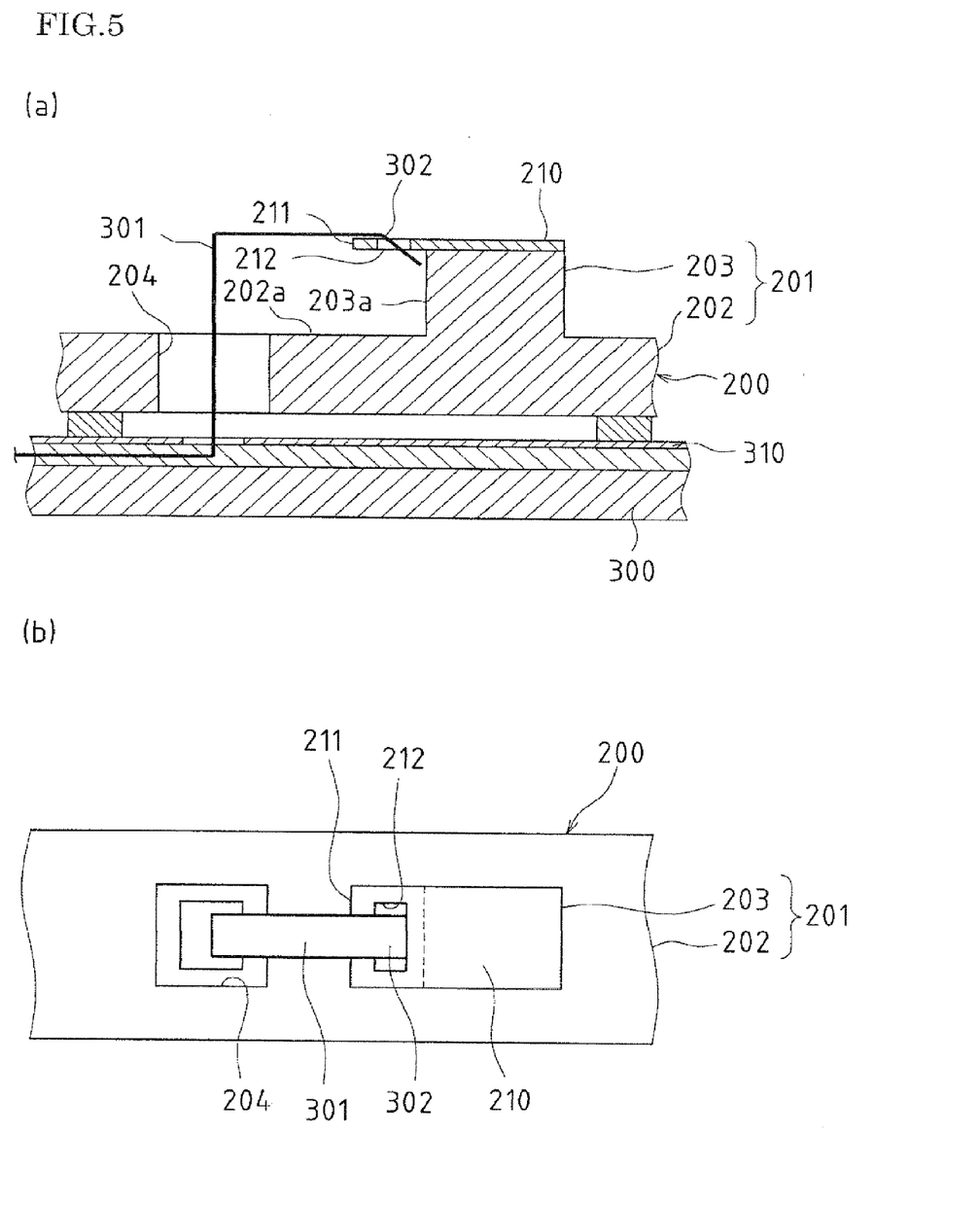
FIG. 5 show a structure of a terminal box according to a conventional technique 1, with FIG. 5(a) being a cross-sectional view and FIG. 5(b) being a plan view.

An example of a conventional terminal box is shown in FIG. 5 as a conventional technique 1. FIG. 5(a) is a cross-sectional view, and FIG. 5(b) is a plan view.

A terminal box 200 according to the conventional technique 1 includes a box case 201 that is placed on and fixed to the back face of the solar cell string 300 in order to electrically connect an output lead wire 301 drawn through a back film 310 of a solar cell string 300 and a terminal panel 210 that is formed on the box case 201. The box case 201 includes a case main body 202 that is placed on and fixed to the back face of the solar cell string 300 and a terminal panel fixing portion 203 for placing and fixing the terminal panel 210 above the case main body 202.

In the case main body 202, a main body through hole 204 for drawing upward the output lead wire 301 drawn from the back face of the solar cell string 300 is formed. One end 211 of the terminal panel 210 facing the main body through hole 204 is provided so as to protrude from the terminal panel fixing portion 203, and a terminal panel through hole 212 for passing a tip 302 of the output lead wire 301 is formed in this protruding portion.

When electrically connecting the output lead wire 301 by using the terminal box 200 configured as described above, firstly, the solar cell string 300 is placed on a workbench (not shown) with its back face facing upward, positioning is performed such that the main body through hole 204 of the terminal box faces the tip 302 of the output lead wire 301 drawn upward from the back face of the solar cell string 300, and the terminal box 200 is placed from above on the solar cell string 300. Next, in this state, the output lead wire 301 protruding upward from the main body through hole 204 is held with tweezers or the like and bent toward the terminal panel 210, and then the tip 302 of the output lead wire 301 is passed through the terminal panel through hole 212 formed in the terminal panel 210 from above. Then, in this state, the output lead wire 301 on the terminal panel 210 is fixed to the terminal panel 210 by soldering, and thereby the output lead wire 301 is attached and fixed to the terminal panel 210.

The reason that the tip 302 of the output lead wire 301 is passed through (latched on) the terminal panel through hole 212 and then fixed by soldering rather than simply fixing the output lead wire by soldering is because it is defined as such by IEC (International Electro Technical Commission) standards which define that simply fixing a wire by soldering will not suffice.

Figure 6:
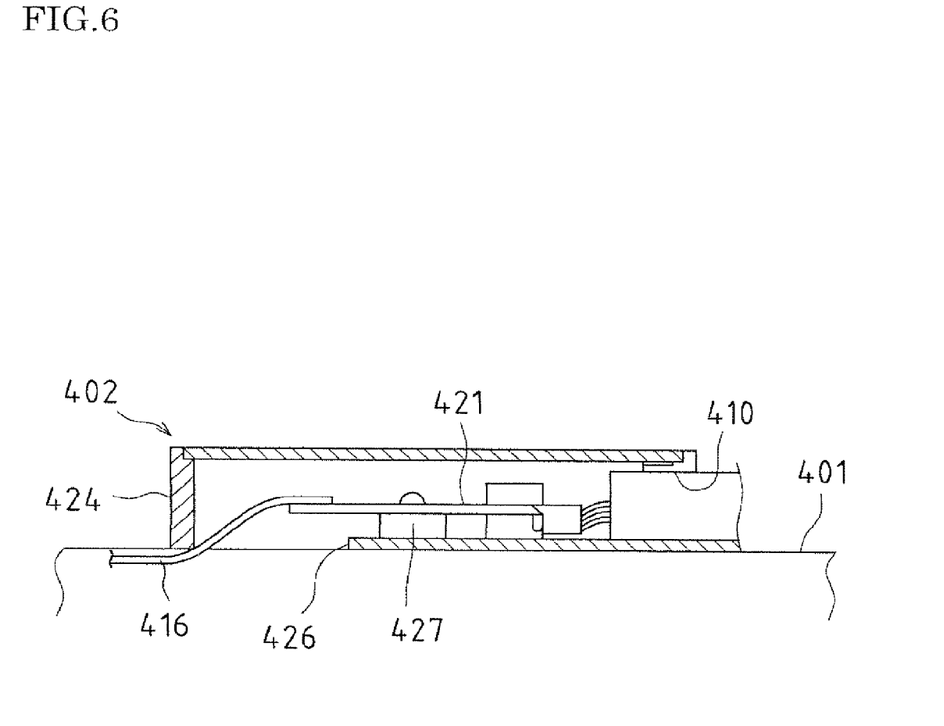
FIG. 6 is a cross-sectional view showing a structure of a terminal box (connection box) disclosed in Patent Document 1.

As another example of a conventional terminal box, the structure of a terminal box (connection box) disclosed in Patent Document 1 is shown in FIG. 6.

A terminal box 402 disclosed in Patent Document 1 has a structure in which the tip of a lead frame 416 inserted from a frame insertion hole 426 is connected, by soldering, to the other longitudinal end of a terminal 421 that is inserted from a cable through hole 410 of a box main body 424 and that is latched on a terminal fixing portion 427 so as to not come out, and the lower face of the box main body 424 of the terminal box 402 is adhesively fixed to the back face of a solar cell string main body 401 with an adhesive.

On the other hand, in the terminal box 100 of the conventional technique 1 described above, the output lead wire 201 and the terminal panel 110 are fixed by soldering, but a terminal box configured to eliminate such a soldering step has been proposed (see, for example, Patent Document 2).

Figure 7:
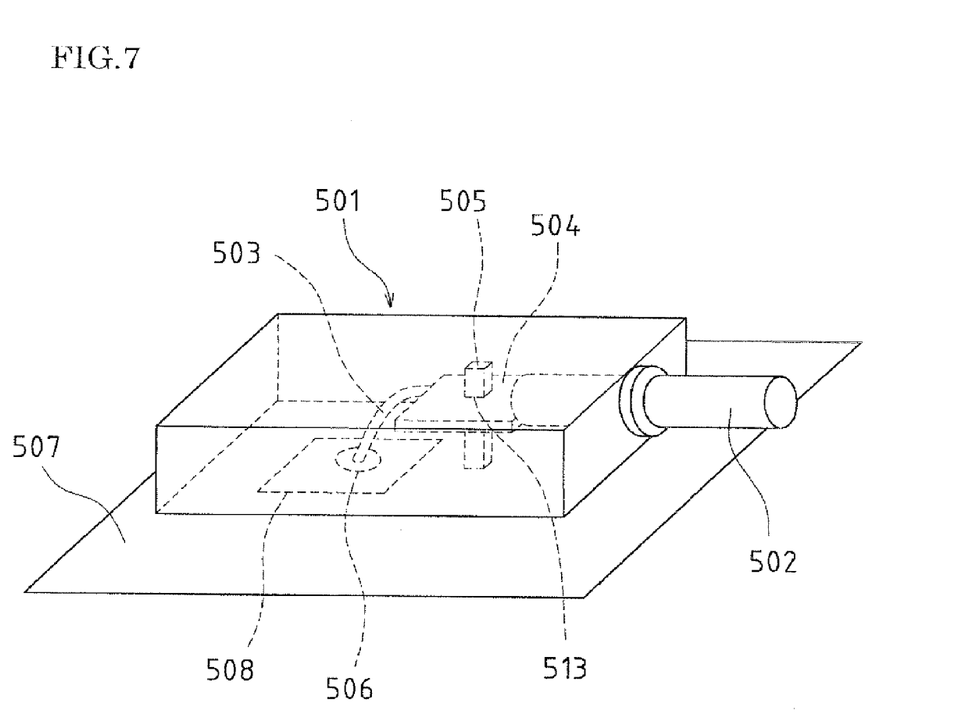
FIG. 7 is an overall perspective view showing a structure of a terminal box (connection box) disclosed in Patent Document 2.

As shown in FIG. 7, a terminal box disclosed in Patent Document 2 is attached so as to cover an electrode lead-out portion 506 of a solar cell string 507, and an internal lead wire insertion hole 508 for inserting an internal lead wire 503 is formed in the bottom face of the terminal box 501. Inside the terminal box 501, a relay terminal support 505 for mechanically fixing a relay terminal 504 is formed near the internal lead wire insertion hole 508. The internal lead wire 503 and an external output line 502 are electrically and mechanically connected to each other by the relay terminal 504, and the relay terminal 504 is mechanically fixed to the relay terminal support 505 with the stick-shaped relay terminal support 505 passing through a locking portion (opening) 513 formed in the relay terminal 504.

PRIOR ART DOCUMENTS

Patent Documents

[Patent Document 1] JP 2001-250974A
[Patent Document 2] JP H11-17204A

SUMMARY OF INVENTION

Problems to be Solved by the Invention

The terminal box of the conventional technique 1 described above is problematic in that it requires a step of passing, from above, the tip 302 of the output lead wire 301, which protrudes upward from the main body through hole 204, through the terminal panel through hole 212 formed in the terminal panel 210, and thus automation is difficult to achieve.

In addition, the main body through hole 204 through which the output lead wire 301 is drawn and the terminal panel through hole 212 formed in the terminal panel 210 for passing the tip 302 of the drawn output lead wire 301 are separately provided, and the output lead wire 301 drawn from the main body through hole 204 is bent and passed through the terminal panel through hole 212. For this reason, there is a problem in that a certain distance is needed from the main body through hole 204 to the terminal panel through hole 212, and the space corresponding to this portion is wasteful. In other words, the problem is that it is difficult to achieve size reduction of the terminal box. This problem may also occur in the terminal boxes disclosed in Patent Documents 1 and 2 described above.

Furthermore, there is a certain distance between the main body through hole 204 and the terminal panel through hole 212, and therefore the output lead wire 301 needs to be drawn upward to a sufficient length from the main body through hole 204. This poses a problem in that the drawn output lead wire 301 becomes unstable, raising a possibility that soldering of the output lead wire 301 to the terminal panel 210 might not be performed in a stable manner. This problem may also occur in the terminal box disclosed in Patent Document 1 described above.

Moreover, the inner diameter of the main body through hole 204 needs to be sufficiently large in order to prevent the output lead wire 301 from coming into contact with the edge of the main body through hole 204 of the terminal box 200 and being bent when the terminal box 200 is placed from above on the solar cell string 300. In other words, it is necessary to form the main body through hole 204 as a large opening. This raises a possibility that when passing, from above, the tip 302 of the output lead wire 301 through the terminal panel through hole 212 of the terminal panel 210, if the output lead wire 301 is inserted deeply, the tip 302 of the output lead wire 301 might come into contact with a side face 203a of the terminal panel fixing portion 203, a top face 202a of the case main body 202 or the like, and thus might be curved into a C shape and run through the main body through hole 204 into the back face of the solar cell string 300. In this case, a problem of low dielectric strength arises.

The terminal box disclosed in Patent Document 1 described above is also problematic in that the lead frame 416 is only soldered onto the terminal 421, and thus the fixing strength is insufficient, and that this method is not in compliance with the IEC standards. Likewise, the terminal box disclosed in Patent Document 2 also has problems in that the internal lead wire 503 and the external output line 502 are fixed to the relay terminal 504 only by soldering, and thus the strength of the soldered portions is insufficient, and that this method is not in compliance with the IEC standards.

The present invention has been conceived to solve the above problems, and it is an object of the present invention to provide a terminal box that has solved the above problems by focusing particular attention on the terminal box of the conventional technique 1 and improving it, and a solar cell module including such a terminal box.

Means for Solving the Problems

In order to solve the above problems, the present invention provides a terminal box that electrically connects output lead wires that are connected to electrodes of solar cells and that are drawn through a back film of the solar cells, the terminal box including: a box case that is placed on and fixed to the back film; and a terminal panel that is formed on the box case and that electrically connects the output lead wires, the box case including a case main body that is placed on and fixed to the back film and a terminal panel fixing portion for placing and fixing the terminal panel above the case main body, wherein an opening for passing the output lead wire through the terminal panel is formed continuously from a bottom face of the case main body to a top face of the terminal panel.

The present invention also provides solar cells module including a terminal box that electrically connects output lead wires that are connected to electrodes of solar cells and that are drawn through a back film of the solar cells, the terminal box including: a box case that is placed on and fixed to the back film; and a terminal panel that is formed on the box case and that electrically connects the output lead wires, the box case including a case main body that is placed on and fixed to the back film and a terminal panel fixing portion for placing and fixing the terminal panel above the case main body, wherein an opening for passing the output lead wire through the terminal panel is formed continuously from a bottom face of the case main body to a top face of the terminal panel.

According to the above configurations, an opening for passing the output lead wire through the terminal panel is formed continuously from the bottom face of the case main body to the top face of the terminal panel. In other words, there is only one opening, and the present invention does not employ a configuration as in the conventional technique 1 in which a main body through hole 104 and a terminal panel through hole 112 are provided separately. Consequently, wasted space as in the terminal box of the conventional technique 1 can be eliminated, reducing the size of the terminal box itself.

Furthermore, according to the present invention, it is preferable that the opening formed in the case main body includes a through hole having a tapered shape that gradually becomes wider from a side communicating with the terminal panel fixing portion toward the bottom face of the case main body. By forming the opening to have such a tapered shape, the opening diameter of the lower end of the opening for passing the output lead wire becomes large, and it is therefore possible to prevent drawbacks such as the output lead wire coming into contact with the edge of the opening and thus being bent.

Furthermore, according to the present invention, it is possible to employ a configuration in which one edge of the terminal panel is provided so as to protrude from the terminal panel fixing portion such that a tip of the output lead wire can be bent and latched on. In other words, in the present invention, the tip of the output lead wire can be latched on and fixed to the terminal panel by bending the output lead wire protruding above from the opening toward one edge of the terminal panel so as to press it against the edge of the opening and bending the tip of the bent output lead wire downward and backward so as to press it against the edge of the terminal panel. That is to say, by bending the output lead wire only twice at two bending points, namely, the edge of the opening of the terminal panel and one edge of the terminal panel, the tip of the output lead wire can be reliably latched on fixed to the terminal panel. Consequently, the next step of soldering the tip of the output lead wire to the terminal panel can be performed in a stable manner, and it is therefore possible to achieve a terminal box attachment structure that is sufficiently in compliance with the IEC standards.

Furthermore, according to the present invention, the terminal panel fixing portion may be formed by a pair of terminal panel fixing pieces that are provided upright with a predetermined spacing therebetween in a lateral direction of the case main body, and a space between the terminal panel fixing pieces may serve as the opening for passing the output lead wire. In other words, the opening formed in the terminal panel fixing portion has a groove-like structure in which two sides are open, rather than a cylindrical hole. Accordingly, when resin-sealing the terminal box by potting after the output lead wire and an external output line have been connected to the terminal box, the potting material can easily flow from the opening into the inside, and it is thereby possible to reliably resin-seal the periphery of the output lead wire drawn through the back film. In this case, it is possible to employ a configuration in which the case main body is provided with an air escape vent extending from the bottom face to a top face of the case main body. By providing the air escape vent, the air present within the opening and in the gap between the back face of the solar cell and the bottom face of the terminal box can escape to the outside through the air escape vent when the potting material flows into the opening, and it is therefore possible to reliably fill the potting material into the opening (more specifically, to the back film of the solar cell within the opening, and to the gap between the back film of the solar cell and the bottom face of the terminal box), as a result of which resin-sealing without creating holes can be performed.

Effects of the Invention

According to the present invention, an opening for passing the output lead wire through the terminal panel is formed continuously from the bottom face of the case main body to the top face of the terminal panel, and thus it is unnecessary to separately provide two through holes as in the conventional technique. Consequently, wasted space as in the terminal box of the conventional technique can be eliminated, reducing the size of the terminal box itself.

MODES FOR CARRYING OUT THE INVENTION

Hereinafter, an embodiment of the present invention will be described with reference to the drawings.

Description of Solar Cell String

Firstly, an example of a configuration of a solar cell string to which a terminal box according to the present invention is applied will be described with reference to FIGS. 3(a), 3(b) and 4.

Solar cells 115 are each formed by laminating, although not shown in the drawings, a transparent electrode film made of a transparent conductive film, a photoelectric conversion layer and a back face electrode film in this order on a light-transmitting insulating substrate 111. The light-transmitting insulating substrate can be made of glass or a heat-resistant resin such as polyimide. The transparent electrode film can be made of SnO2, ZnO, ITO or the like. The photoelectric conversion layer can be made of amorphous silicon, microcrystalline silicon or the like.

Figure 3:
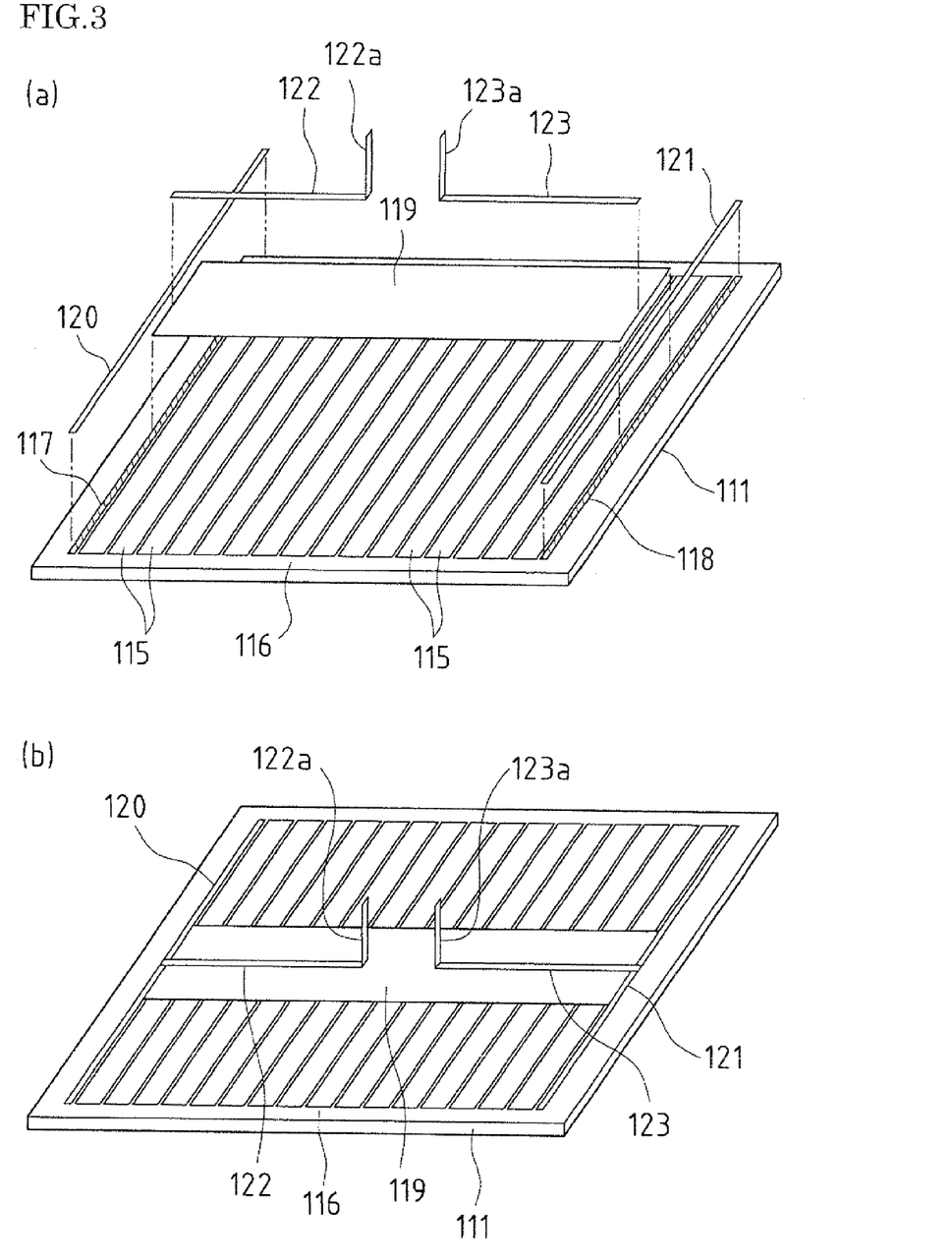
FIG. 3 show an example of a configuration of a solar cell string, with FIGS. 3(a) and 3(b) showing two scenes of a manufacturing process thereof.

Each solar cell 115 thus configured has, as shown in FIG. 3(a), a long strip shape with a length extending substantially across the entire width of the light-transmitting insulating substrate 111. A solar cell string 116 in which a plurality of solar cells 115 are connected in series is configured by connecting the transparent electrode film of one of each two adjacent solar cells 115 and the back face electrode film of the other solar cell to each other.

On an end of the transparent electrode film of the solar cell 115 located at one end of the solar cell string 116, a P-type electrode terminal portion 117 having a linear shape with substantially the same length as the solar cell 115 is formed, and on an end of the back face electrode film of the solar cell 115 located at the other end of the solar cell string 116, an N-type electrode terminal portion 118 having a linear shape with substantially the same length as the solar cell 115 is formed. The P-type electrode terminal portion 117 and the N-type electrode terminal portion 118 serve as electrode lead-out portions. By forming these electrode terminal portions to have the same length as the solar cell 115 as described above, a current flowing through the solar cells 115 of the solar cell string 116 in series can be extracted uniformly without local concentration of the current, and it is therefore possible to suppress the occurrence of series resistance losses.

An insulating film 119 is placed on the solar cell string 116 so as to extend between a center area of the P-type electrode terminal portion 117 and a center area of the N-type electrode terminal portion 118. The insulating film 119 is placed such that it does not overlap the P-type electrode terminal portion 117 and the N-type electrode terminal portion 118. The insulating film 119 is preferably a thermoplastic polymer film, and in particular, it is optimal to use a film made of EVA (ethylene vinyl acetate resin).

On the other hand, a positive electrode current collecting portion 120 called "bus bar" and made of a copper foil having the same shape and size as the P-type electrode terminal portion 117 is electrically and mechanically bonded to the entire face of the P-type electrode terminal portion 117. Likewise, a negative electrode current collecting portion 121 having the same shape and size as the N-type electrode terminal portion 118 is electrically and mechanically bonded to the entire face of the N-type electrode terminal portion 118. As a means of bonding these, soldering or a conductive paste can be used, for example.

A positive electrode lead wire 122 and a negative electrode lead wire 123 that are made of flat cables are disposed in line (or parallel, i.e., disposed offset in the width direction) on the insulating film 119, with their tips facing each other.

One end of the positive electrode lead wire 122 is connected to a center position of the positive electrode current collecting portion 120. The other end of the positive electrode lead wire 122 is located in a substantially center area of the solar cell string 116, and is bent vertically with respect to the face of the solar cell string 116 to serve as an upstanding terminal portion 122a. Likewise, one end of the negative electrode lead wire 123 is connected to a center position of the negative electrode current collecting portion 121. The other end of the negative electrode lead wire 123 is located in a substantially center area of the solar cell string 116, and is bent vertically with respect to the face of the solar cell string 116 to serve as an upstanding terminal portion 123a.

The positive electrode lead wire 122 and the negative electrode lead wire 123 are made of the same material (namely, a copper foil) as that of the positive electrode current collecting portion 20 and the negative electrode current collecting portion 21, and as a means of bonding the lead wires and the current collecting portions, soldering or spot welding can be used, for example. Although the positive electrode lead wire 122 and the negative electrode lead wire 123 extend across a plurality of solar cells 115, the insulating film 119 is present between the lead wires and the solar cells 115, and therefore the solar cells 115 will not be short-circuited. It is desirable that the width of the insulating film 119 is sufficiently larger than the width of the positive electrode lead wire 122 and the negative electrode lead wire 123, and the insulating film 119 is disposed in the form of a belt-like sheet extending from the positive electrode current collecting portion 120 to the negative electrode current collecting portion 121.

Figure 4:
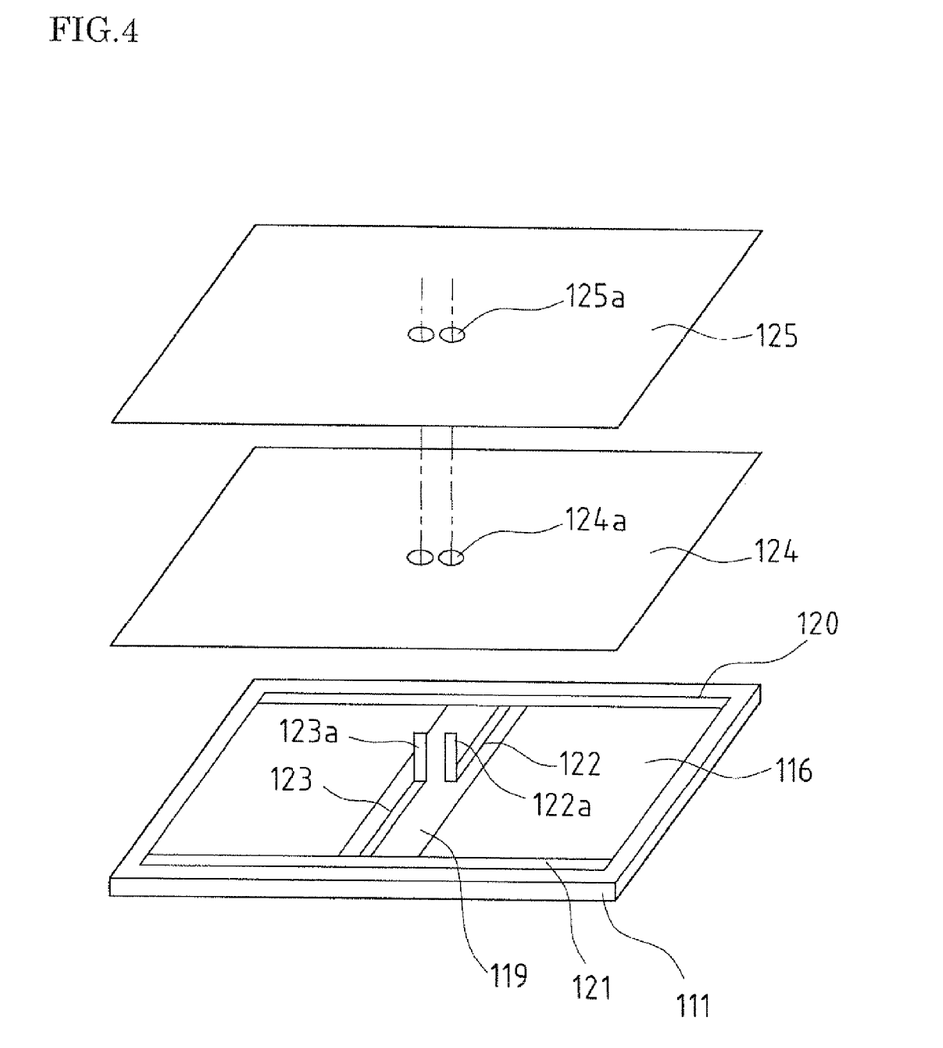
FIG. 4 is an explanatory diagram showing a step of laminating and sealing the solar cell string.

In this state, as shown in FIG. 4, a sealing insulating film 124 and a back film 125 serving as a back face protection material for weather resistance and high insulation are laminated and sealed on the entire face of the solar cell string 116, with the upstanding terminal portions 122a and 123a of the positive electrode lead wire 122 and the negative electrode lead wire 123 passing through through holes 124a and through holes 125a. The sealing insulating film 124 is preferably a thermoplastic polymer film made of the same material as that of the insulating film 119, and in particular, it is optimal to use a film made of EVA (ethylene vinyl acetate resin). When the sealing insulating film 124 is a thermoplastic polymer film made of the same material as that of the insulating film 119, molecular bonding between the sealing insulating film 124 and the insulating film 119 proceeds effectively during thermal fusion in the laminating/sealing process, forming a complete one piece after cooling, and it is thereby possible to improve the water resistance of the solar cell string. The back film 125 preferably has a three-layer structure of PET/Al/PET (PET: polyethylene terephthalate). As for the thicknesses of these films, for example, when the insulating film 119 has a thickness of 100 μm and the sealing insulating film 124 has a thickness of 600 μm, the back film 125 has a thickness of 100 μm.

In the solar cell string 116 thus configured, a terminal box according to the present invention is attached and electrically connected to the upstanding terminal portions 122a and 123a of the positive electrode lead wire 122 and the negative electrode lead wire 123 protruding upward from the through holes 125a of the back film 125, an external output line is electrically attached to the terminal box, and thereby a solar cell module is produced.

The electrode arrangement in the solar cell string 116 is merely exemplary, and the arrangement is not limited thereto. For example, the positive electrode lead wire 122 and the negative electrode lead wire 123 may be disposed at a position toward one of the ends of the solar cell string 116, rather than the center area of the solar cell string 116, and the lead wires may not need to be drawn to the center area. In other words, the positive electrode lead wire 122 and the negative electrode lead wire 123 may be disposed such that the upstanding terminal portions 122a and 123a protrude upward from near the positive electrode current collecting portion 20 and the negative electrode current collecting portion 21, respectively.

<Description of Terminal Box>

Figure 1:
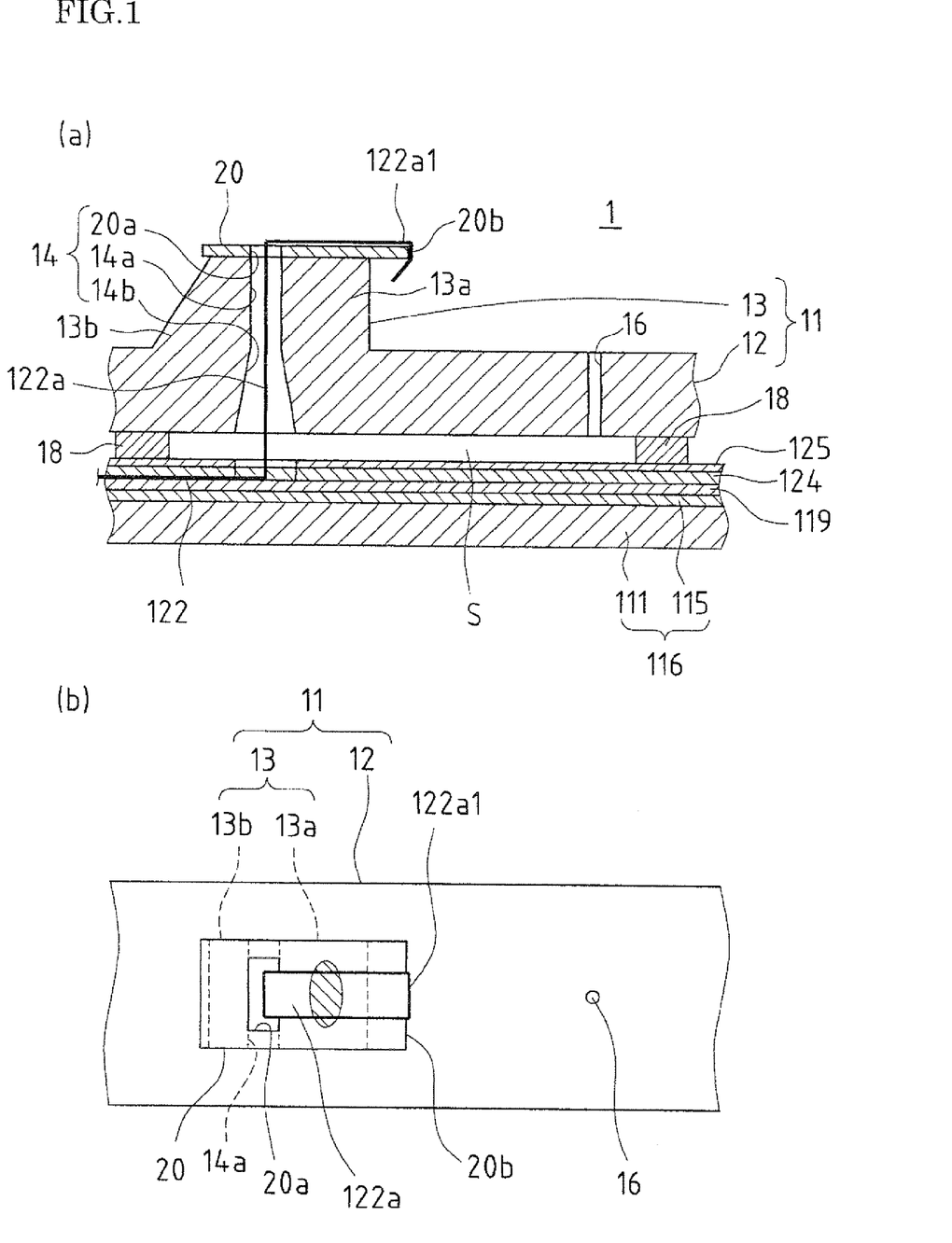
FIG. 1 show a terminal box according to an embodiment of the present invention, with FIG. 1(a) being a cross-sectional view and FIG. 1(b) being a plan view.
Figure 2:
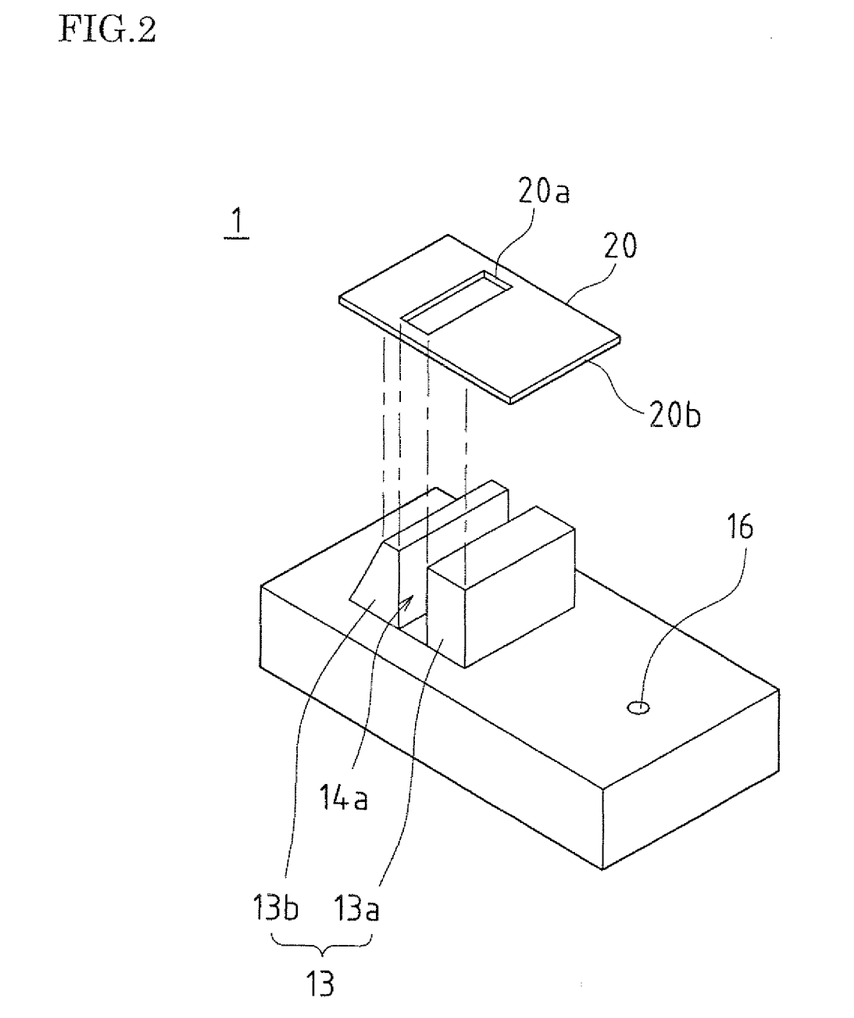
FIG. 2 is a perspective view of the terminal box according to the embodiment.

FIG. 1 show a terminal box according to an embodiment of the present invention, with FIG. 1(a) being a schematic cross-sectional view and FIG. 1(b) being a plan view. FIG. 2 is a perspective view of the terminal box from which a terminal panel portion has been separated. The terminal box is attached to each of the upstanding terminal portion 122a of the positive electrode current collecting portion 20 and the upstanding terminal portion 123a of the negative electrode current collecting portion 21, but the attachment structure is the same, and thus the present embodiment will be described in the context of the terminal box being attached to the upstanding terminal portion 122a of the positive electrode current collecting portion 20.

A terminal box 1 according to the present embodiment includes a box case 11 that is placed on and fixed to the back film 125 of the solar cell string 116 in order to electrically connect the upstanding terminal portion (hereinafter also referred to as "output lead wire") 122a drawn from the back face of the solar cell string 116 through the back film 125 and a terminal panel 20 that is formed on the box case 11. The box case 11 includes a case main body 12 that is placed on and fixed to the back film 125 of the solar cell string 116 and a terminal panel fixing portion 13 for placing and fixing the terminal panel 20 above the case main body 12.

In the present embodiment, the box case 11 is formed to have a rectangular parallelepiped shape that is long in the sideways direction in FIG. 1(b) and short in the width direction, and the terminal panel fixing portion 13 is formed to have a substantially cubic shape as a whole.

In such a configuration of the box case 11, in the present embodiment, an opening 14 (14a, 14b, 20a) for passing the output lead wire 122a through the terminal panel 20 is formed continuously from the bottom face of the case main body 11 to the top face of the terminal panel 20. In other words, there is only one opening for passing the output lead wire 122a, and the present embodiment does not employ a configuration as in the conventional technique 1 in which a main body through hole 104 and a terminal panel through hole 112 are provided separately. Consequently, wasted space as in the terminal box of the conventional technique 1 can be eliminated, reducing the size of the terminal box itself.

In the present embodiment, as shown in FIG. 2, the opening 14a formed in the terminal panel fixing portion 13 is formed by a pair of terminal panel fixing pieces 13a and 13b that are provided upright with a predetermined spacing therebetween in the lateral direction of the case main body 11, and the space between the terminal panel fixing pieces 13a and 13b serves as the opening 14a for passing the output lead wire 122a. In other words, the opening 14a formed in the terminal panel fixing portion 3 has a groove-like structure in which two sides are open, rather than a cylindrical hole. Accordingly, when resin-sealing the terminal box 1 by potting after the output lead wire 122a and an external output line (not shown) for connecting another solar cell module disposed adjacent thereto have been connected to the terminal box 1, the potting material can easily flow from the opening 14a into the opening 14b provided in the case main body 11 (and to the back film 125 of the solar cell string 116), and it is thereby possible to reliably resin-seal the periphery of the output lead wire 122a drawn from the back film 125 of the solar cell string 116.

The opening 20a of the terminal panel 20 is also formed to have a rectangular shape that is long in the width direction so as to conform to the above-described shape of the opening 14a.

Also, in the present embodiment, the opening 14b formed in the case main body 11 is formed to have a quadrilateral shape as viewed from above, and the inner wall face is formed to have a tapered shape that gradually becomes wider from the side communicating with the terminal panel fixing portion 13 (in other words, the lower edge of the opening 14a) toward the bottom face of the case main body 11. By forming the opening 14b to have such a tapered shape, the opening diameter of the lower end of the opening 14b for passing the output lead wire 122a becomes large, and it is therefore possible to prevent drawbacks such as the output lead wire 122a coming into contact with the edge of the opening 14b and thus being bent when the terminal box 1 is placed from above.

Also, in the present embodiment, the terminal panel 20 is formed to have a quadrilateral shape so as to conform to the shape of the top face of the terminal panel fixing portion 13, but one edge 20b is provided so as to protrude from the terminal panel fixing portion 13 so that a tip 122a1 of the output lead wire 122a can be bent and latched on. In other words, in the present embodiment, the tip 122*a*1 of the output lead wire 122*a* can be latched on and fixed to the terminal panel 20 by bending the output lead wire 122*a* protruding above from the opening 20*a* of the terminal panel 20 toward one edge of the terminal panel 20 (toward the right in FIG. 1) so as to pres it against the edge of the opening 20*a* and bending the tip of the bent output lead wire downward and backward so as to press it against the edge 20*b* of the terminal panel 20. That is to say, by bending the output lead wire 122*a* only twice at two bending points, namely, the edge of the opening 20*a* of the terminal panel 20 and one edge 20*b* of the terminal panel 20, the tip 122*a*1 of the output lead wire 122*a* can be reliably latched on and fixed to the terminal panel 20. Consequently, the next step of soldering the bent portions of the output lead wire 122*a* to the terminal panel 20 can be performed in a stable manner, and it is therefore possible to achieve a terminal box attachment structure that is sufficiently in compliance with the IEC standards. In addition, this eliminates the need for a space for routing the output lead wire in order to perform soldering as in the conventional technique, and thus provides an advantage of enhancing the degree of freedom of arrangement of diodes, other wires and the like that are provided in the terminal box.

Also, in the present embodiment, an air escape vent 16 extending from the bottom face to the top face of the case main body 11 may be provided at an appropriate location of the case main body 11. It should be noted, however, that the air vent 16 is provided at a position sufficiently away from the terminal panel fixing portion 13. In order to attach the terminal box 1 onto the back film 125 of the solar cell string 116, an adhesive silicon resin 18 is applied to the bottom face of the case main body 12 of the terminal box 1 at the periphery thereof (it may be applied around the entire periphery or may be applied to four corners, for example). Thus, when the terminal box 1 is adhesively fixed onto the back film 125 of the solar cell string 116, a gap S corresponding to the thickness of the silicon resin 18 is created between the bottom face of the case main body 12 and the back film 125 of the solar cell string 116. Accordingly, by providing the air escape vent 16, the air present within the opening 14 and in the gap S between the back film 125 of the solar cell string 116 and the bottom face of the case main body 12 of the terminal box 1 can escape to the outside through the air escape vent 16 when the potting material flows into the opening 14, and it is therefore possible to reliably fill the potting material into the opening 14 (more specifically, to the back film 125 of the solar cell string 116 within the opening 14, and to the gap S between the back film 125 of the solar cell string 116 and the bottom face of the case main body 12 of the terminal box 1), as a result of which resin-sealing without creating holes can be performed.

Although not shown in the drawings, as the method of fixing an external output line fixed onto the terminal panel 20, a method can be used in which a connection end of the external output line is secured directly to the other end of the terminal panel 20 by means of a rivet or the like. As described above, a solar cell module is produced by attaching the terminal box 1 onto the back film 125 of the solar cell string 116, electrically connecting the output lead wire 122*a* to the terminal panel 20, and electrically connecting an external output line to the terminal panel 20.

The present invention may be embodied in various other forms without departing from the gist or essential characteristics thereof. Therefore, the embodiment given above is to be considered in all respects as illustrative and not limiting. The scope of the invention is indicated by the appended claims rather than by the foregoing description, and all modifications or changes that come within the meaning and range of equivalency of the claims are intended to be embraced therein.

DESCRIPTION OF REFERENCE NUMERALS

1 Terminal Box
11 Box Case
12 Case Main Body
13 Terminal Panel Fixing Portion
13*a*, 13*b* Terminal Panel Fixing Piece
14 (14*a*, 14*b*, 20*a*) Opening
16 Air Escape Vent
20 Terminal Panel
20*b* One Edge
111 Light-Transmitting Insulating Substrate
115 Solar Cell
116 Solar Cell String (Thin Film Solar Cell String)
117 P-Type Electrode Terminal Portion
118 N-Type Electrode Terminal Portion
119 Insulating Film
120 Positive Electrode Current Collecting Portion
121 Negative Electrode Current Collecting Portion
122 Positive Electrode Lead Wire
123 Negative Electrode Lead Wire
122*a*, 123*a* Upstanding Terminal Portion
122*a*1 Tip
124 Sealing Insulating Film
125 Back Film
124*a*, 125*a* Through Hole

The invention claimed is:

1. A terminal box that electrically connects output lead wires that are connected to electrodes of solar cells and that are drawn through a back face protection material of the solar cells, the terminal box comprising:
a box case that is placed on and fixed to the back face protection material; and a terminal panel that is disposed on the box case and that electrically connects the output lead wires,
wherein an opening for passing the output lead wire through the terminal panel is formed continuously from a bottom face of the box case to a top face of the terminal panel.

2. A terminal box that electrically connects output lead wires that are connected to electrodes of solar cells and that are drawn through a back face protection material of the solar cells, the terminal box comprising:
a box case that is placed on and fixed to the back face protection material; and a terminal panel that is disposed on the box case and that electrically connects the output lead wires,
wherein the box case is provided with an opening for passing the output lead wire through the terminal panel, and
a protruding portion that allows a tip of the output lead wire to be bent and latched on is provided in one edge of the terminal panel, and
wherein the protruding portion formed in the edge protrudes over a side of a terminal panel fixing piece that is opposite from the opening, such that the output lead wire may be passed through the opening before the lead wire is bent and latched onto the protruding portion.

3. The terminal box according to claim 1,
wherein the opening comprises a through hole having a tapered shape that gradually becomes wider from a top face of the box case toward the bottom face of the box case.

4. The terminal box according to claim 1,
wherein the box case comprises a case main body that is placed on and fixed to the back face protection material and a terminal panel fixing portion for placing and fixing the terminal panel above the case main body.

5. The terminal box according to claim 1,
wherein the terminal panel fixing portion is formed by a pair of terminal panel fixing pieces that are provided upright with a predetermined spacing therebetween in a lateral direction of the case main body, and a space between the terminal panel fixing pieces serves as the opening for passing the output lead wire.

6. The terminal box according to claim 1,
wherein the case main body is provided with an air escape vent extending from a bottom face to a top face of the case main body.

7. A solar cell module comprising a terminal box that electrically connects output lead wires that are connected to electrodes of solar cells and that are drawn through a back face protection material of the solar cells,
the terminal box comprising:
a box case that is placed on and fixed to the back face protection material; and a terminal panel that is formed on the box case and that electrically connects the output lead wires,
wherein an opening for passing the output lead wire through the terminal panel is formed continuously from a bottom face of the box case to a top face of the terminal panel.

8. A solar cell module comprising a terminal box that electrically connects output lead wires that are connected to electrodes of solar cells and that are drawn through a back face protection material of the solar cells,
the terminal box comprising:
a box case that is placed on and fixed to the back face protection material; and a terminal panel that is formed on the box case and that electrically connects the output lead wires,
wherein the box case is provided with an opening for passing the output lead wire through the terminal panel, and a protruding portion that allows a tip of the output lead wire to be bent and latched on is provided in one edge of the terminal panel, and
wherein the protruding portion formed in the edge protrudes over a side of a terminal panel fixing piece that is opposite from the opening, such that the output lead wire may be passed through the opening before the lead wire is bent and latched onto the protruding portion.

* * * * *

UNITED STATES PATENT AND TRADEMARK OFFICE
CERTIFICATE OF CORRECTION

PATENT NO. : 8,536,466 B2
APPLICATION NO. : 12/996432
DATED : September 17, 2013
INVENTOR(S) : Shimizu et al.

It is certified that error appears in the above-identified patent and that said Letters Patent is hereby corrected as shown below:

In the Claims

In Column 11, line 12 correct the dependency of claim 5 as follows:

5. The terminal box according to claim 1,
wherein the terminal panel fixing portion is formed by a pair of terminal panel fixing pieces that are provided upright with a predetermined spacing therebetween in a lateral direction of the case main body, and a space between the terminal panel fixing pieces serves as the opening for passing the output lead wire.

--5. The terminal box according to claim 4,
wherein the terminal panel fixing portion is formed by a pair of terminal panel fixing pieces that are provided upright with a predetermined spacing therebetween in a lateral direction of the case main body, and a space between the terminal panel fixing pieces serves as the opening for passing the output lead wire.--

In Column 11, line 20 correct the dependency of claim 6 as follows:

6. The terminal box according to claim 1,
wherein the case main body is provided with an air escape vent extending from a bottom face to a top face of the case main body.

--6. The terminal box according to claim 4,
wherein the case main body is provided with an air escape vent extending from a bottom face to a top face of the case main body.--

Signed and Sealed this
Eighth Day of April, 2014

Michelle K. Lee
*Deputy Director of the United States Patent and Trademark Office*